(12) United States Patent
Suzuki et al.

(10) Patent No.: US 10,666,234 B2
(45) Date of Patent: May 26, 2020

(54) TRANSMISSION CIRCUIT AND INTEGRATED CIRCUIT

(71) Applicant: SOCIONEXT INC., Yokohama-shi, Kanagawa (JP)

(72) Inventors: Daisuke Suzuki, Yokohama (JP); Shigeaki Kawai, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 16/215,210

(22) Filed: Dec. 10, 2018

(65) Prior Publication Data

US 2019/0229712 A1 Jul. 25, 2019

(30) Foreign Application Priority Data

Jan. 22, 2018 (JP) .................................. 2018-008321

(51) Int. Cl.
*H03K 3/017* (2006.01)
*H03K 5/156* (2006.01)

(52) U.S. Cl.
CPC ........... *H03K 3/017* (2013.01); *H03K 5/1565* (2013.01)

(58) Field of Classification Search
CPC ........ H03K 3/017; H03K 7/08; H03K 5/1565; H03K 19/21; H03K 5/14; H03K 5/26

USPC ................................. 327/172, 173, 174, 175
See application file for complete search history.

(56) References Cited

U.S. PATENT DOCUMENTS

| 6,507,220 B1 | 1/2003 | Groen et al. |
| 8,462,906 B1 | 6/2013 | Ding |
| 2010/0073058 A1* | 3/2010 | Ohtomo .................. H03K 5/06 327/175 |
| 2010/0219870 A1 | 9/2010 | Kikuchi |

FOREIGN PATENT DOCUMENTS

| JP | 2010-206348 A | 9/2010 |
| WO | WO 2008/111241 A1 | 9/2008 |

OTHER PUBLICATIONS

Communication from the European Patent Office in counterpart European Application No. 18211875.2, dated Jul. 3, 2019.

* cited by examiner

*Primary Examiner* — John W Poos
(74) *Attorney, Agent, or Firm* — Arent Fox LLP

(57) ABSTRACT

A transmission circuit includes: a data generating circuit configured to generate data based on a clock signal; a clock generating circuit configured to supply the clock signal to the data generating circuit; and a duty ratio controlling circuit configured to detect a duty cycle distortion of the data output from the data generating circuit, and control a duty ratio of the clock signal based on a result of the detection.

16 Claims, 7 Drawing Sheets

F I G. 1
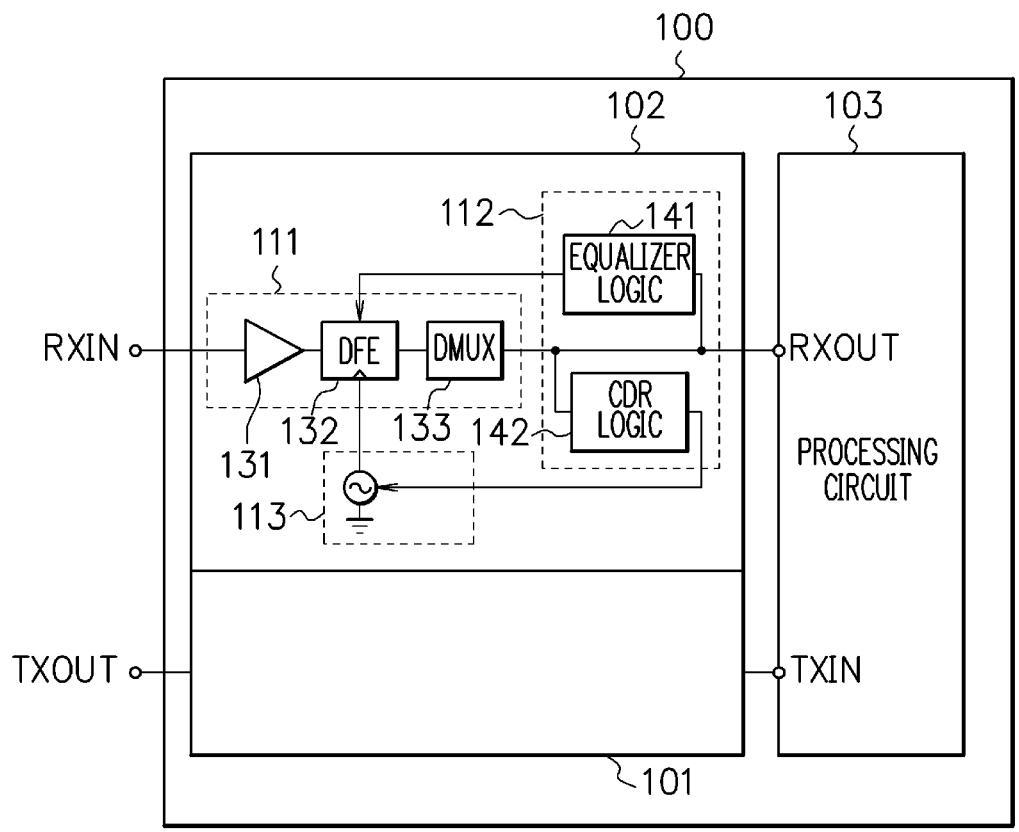
F I G. 2
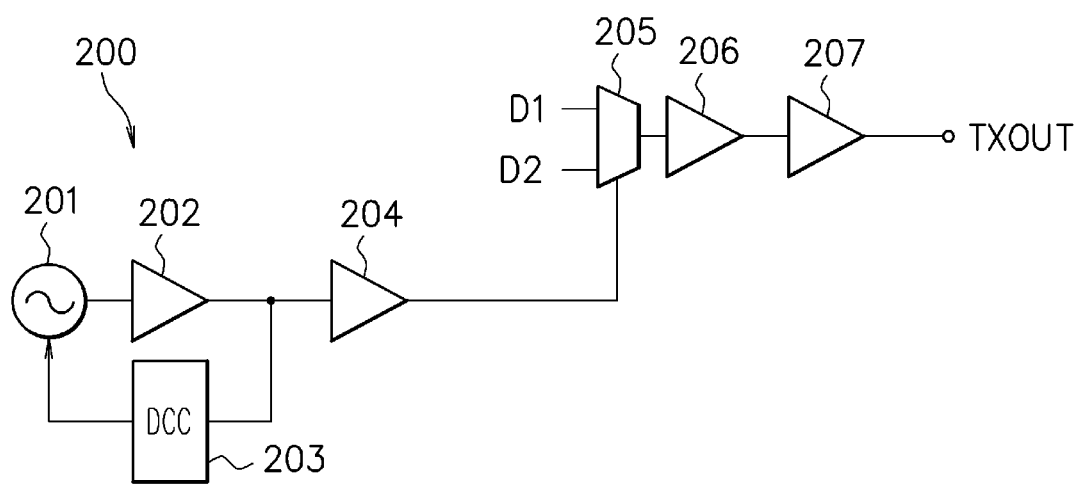

F I G. 4
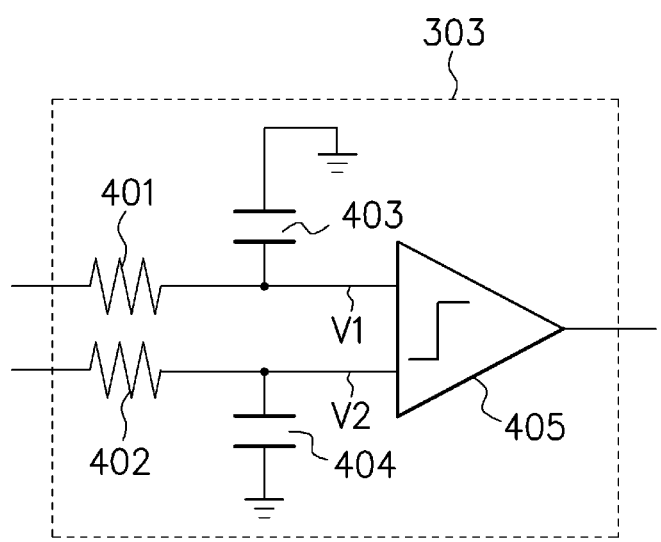

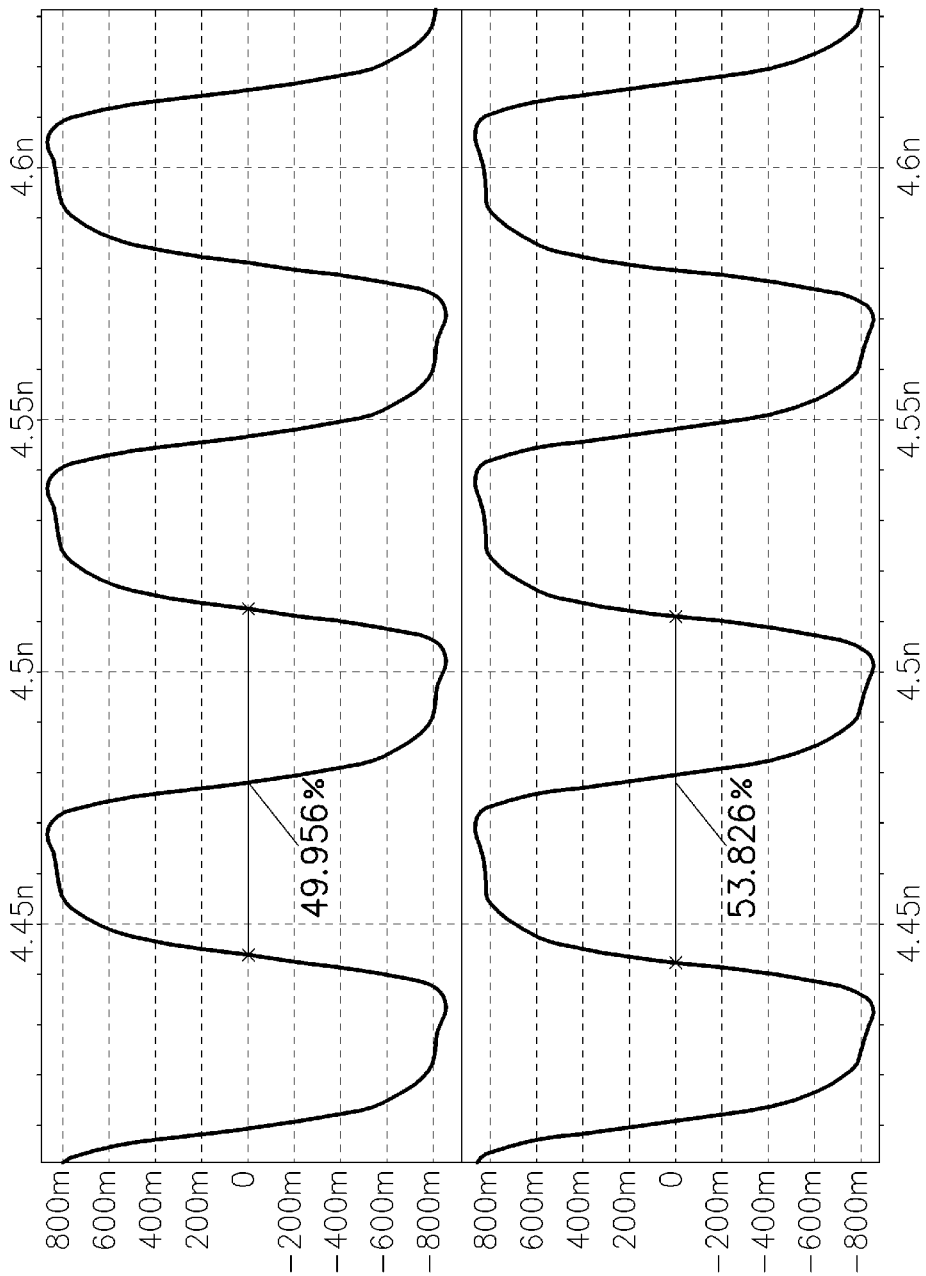

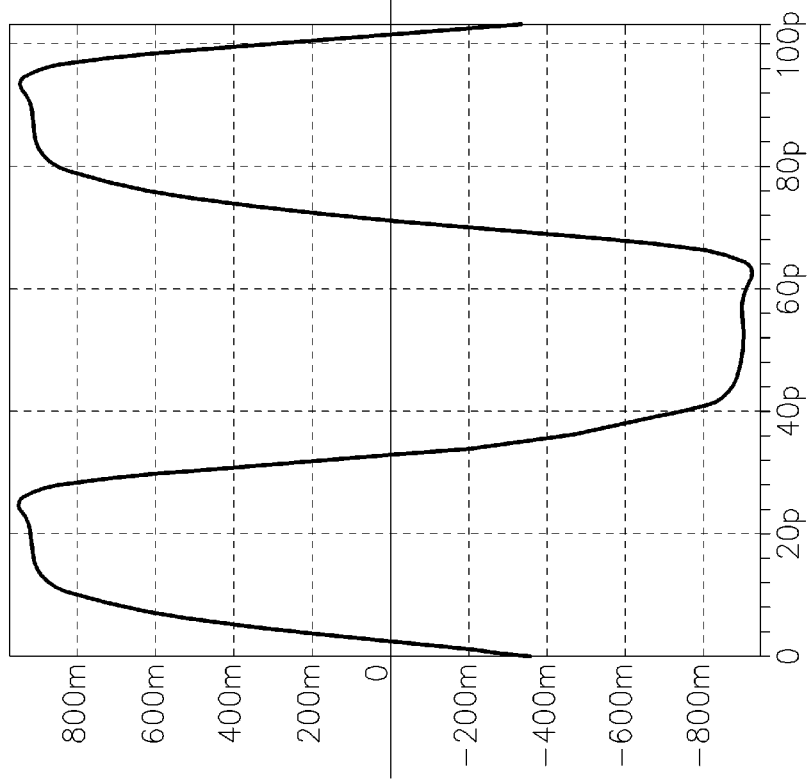

TRANSMISSION CIRCUIT AND INTEGRATED CIRCUIT

CROSS-REFERENCE TO RELATED APPLICATION

This application is based upon and claims the benefit of priority of the prior Japanese Patent Application No. 2018-008321, filed on Jan. 22, 2018, the entire contents of which are incorporated herein by reference.

FIELD

The embodiments discussed herein are directed to a transmission circuit and an integrated circuit.

BACKGROUND

There is known a duty ratio correcting circuit having an input buffer for clock to which a first clock signal is input, and an input buffer for data to which a first data signal is input (refer to Patent Document 1). A duty adjusting circuit for clock adjusts, based on a correction signal, a duty ratio of a second clock signal output from the input buffer for clock, to thereby generate a third clock signal. A duty adjusting circuit for data adjusts, based on the correction signal, a duty ratio of a second data signal output from the input buffer for data, to thereby generate a third data signal. A duty comparison circuit generates the correction signal based on the third clock signal.

Further, there is known a clock/data recovery circuit having a data duty correcting circuit for outputting correction data obtained by correcting the duty of input data according to the level of a correction signal (refer to Patent Document 2). A clock recovery circuit generates a recovered clock synchronized with the edge timing of the correction data. A data identifying circuit identifies the correction data by the recovered clock. A data duty detecting circuit detects the duty of the correction data by the recovered clock and outputs the correction signal indicating a duty correction amount to the data duty correcting circuit.

Patent Document 1: Japanese Laid-open Patent Publication No. 2010-206348

Patent Document 2: International Publication Pamphlet No. WO 2008/111241

A duty cycle distortion (DCD) is a distortion caused when a pulse width of data of 1 and a pulse width of data of 0 are different. When data is generated based on a clock signal, even if a duty ratio of the clock signal is corrected to 50%, a duty cycle distortion sometimes occurs in the data.

SUMMARY

A transmission circuit includes: a data generating circuit configured to generate data based on a clock signal; a clock generating circuit configured to supply the clock signal to the data generating circuit; and a duty ratio controlling circuit configured to detect a duty cycle distortion of the data output from the data generating circuit, and control a duty ratio of the clock signal based on a result of the detection.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram illustrating a configuration example of an integrated circuit according to a first embodiment;

FIG. 2 is a diagram illustrating a configuration example of a transmission circuit according to a basic technique;

FIG. 4 is a circuit diagram illustrating a configuration example of a DCD detecting circuit;

FIG. 5A is a diagram illustrating an example of waveform of a clock signal before performing DCD adjustment, and FIG. 5B is a diagram illustrating an example of waveform of a clock signal after performing the DCD adjustment;

FIG. 6A is a diagram illustrating an example of waveform of data before performing the DCD adjustment, and FIG. 6B is a diagram illustrating an example of waveform of data after performing the DCD adjustment;

DESCRIPTION OF EMBODIMENTS (First Embodiment)

Figure 3:
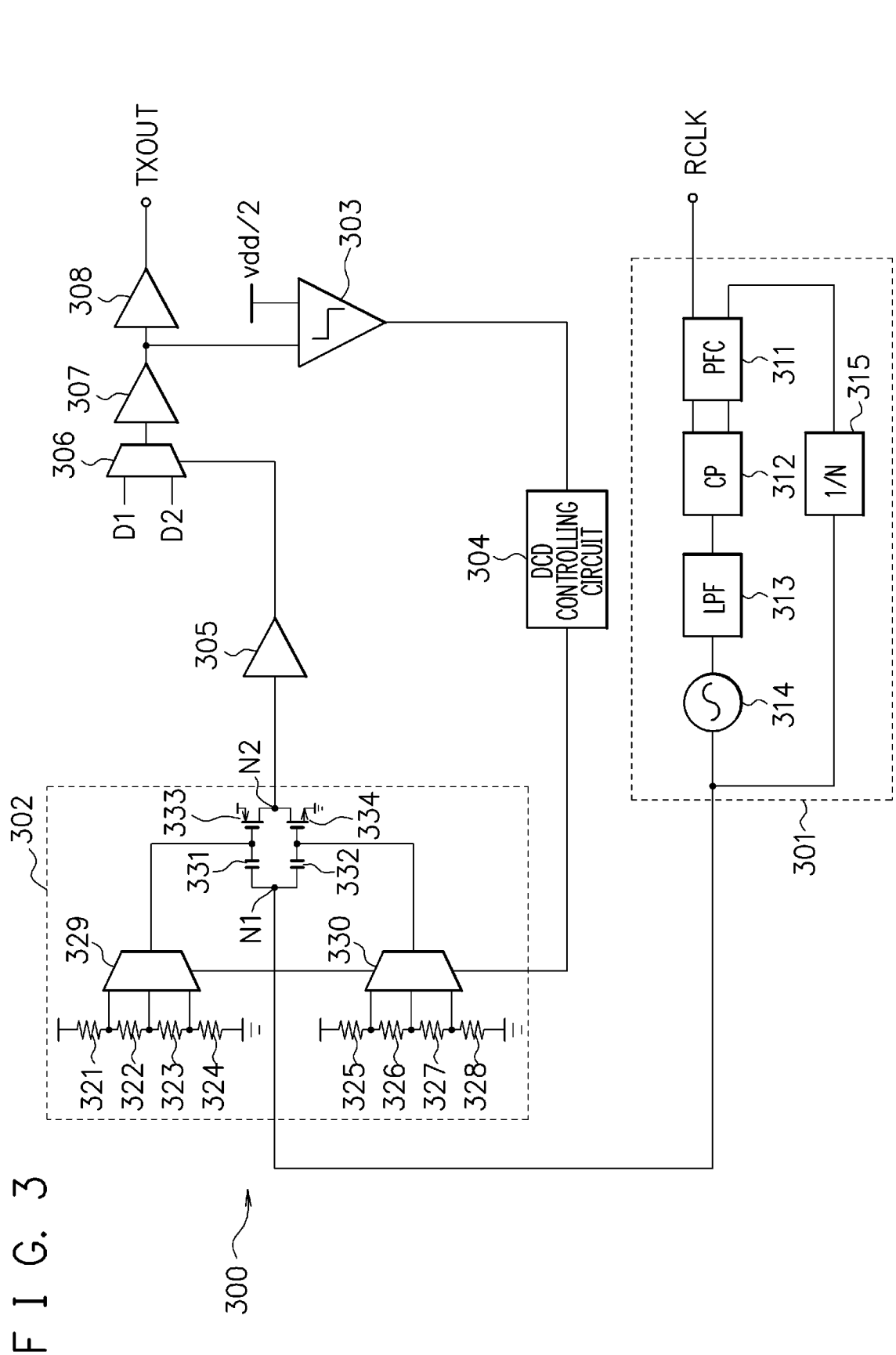
FIG. 3 is a diagram illustrating a configuration example of a transmission circuit according to the first embodiment.

FIG. 1 is a diagram illustrating a configuration example of an integrated circuit 100 according to a first embodiment. The integrated circuit 100 has a transmission circuit 101, a reception circuit 102, and a processing circuit 103. The processing circuit 103 is an internal circuit, and it generates internal data and outputs the parallel internal data TXIN to the transmission circuit 101. The transmission circuit 101 inputs the parallel internal data TXIN thereto, converts the parallel internal data TXIN to serial data, and transmits the serial data TXOUT.

The reception circuit 102 has a front end 111, a logic unit 112, and a clock generating circuit 113. The front end 111 has a continuous time linear equalizer (CTLE) 131, a decision feedback equalizer (DFE) 132, and a demultiplexer 133. The logic unit 112 has an equalizer logic part 141, and a clock data recovery (CDR) logic part 142.

The reception circuit 102 receives serial data RXIN. The CTLE 131 compensates a frequency characteristic of a transmission path with respect to the data RXIN. The DFE 132 performs, in synchronization with a clock signal generated by the clock generating circuit 113, equalization and binary determination on output data of the CTLE 131 based on an equalization coefficient output by the equalizer logic part 141. The demultiplexer 133 converts data output by the DFE 132 from serial data to parallel data. The equalizer logic part 141 outputs the equalization coefficient to the DFE 132 based on the parallel data output by the demultiplexer 133. The CDR logic part 142 controls a phase of the clock signal generated by the clock generating circuit 113 based on the parallel data output by the demultiplexer 133. The reception circuit 102 outputs the parallel data output by the demultiplexer 133 to the processing circuit 103 as reception data RXOUT. The processing circuit 103 processes the reception data RXOUT.

FIG. 2 is a diagram illustrating a configuration example of a transmission circuit 200 to be a comparison example of the first embodiment. The transmission circuit 200 corresponds to the transmission circuit 101 in FIG. 1. The transmission circuit 200 has a clock generating circuit 201, buffers 202, 204, 206, 207, a duty cycle corrector (DCC) 203, and a multiplexer 205. Data D1 and data D2 indicate parallel data corresponding to the data TXIN in FIG. 1, but, data of 3-bit or more may also be employed.

The clock generating circuit 201 generates a clock signal. The buffer 202 amplifies the clock signal generated by the clock generating circuit 201, and outputs the amplified clock signal. The duty cycle corrector 203 controls a phase of the clock signal generated by the clock generating circuit 201 so that a duty ratio of the clock signal output by the buffer 202 becomes 50%. The buffer 204 amplifies the clock signal output by the buffer 202, and outputs the amplified clock signal to the multiplexer 205. The multiplexer 205 converts the parallel data D1 and D2 to serial data in synchronization with the clock signal output by the buffer 204. The buffers 206 and 207 amplify the serial data, and transmit the amplified serial data TXOUT.

Even if the duty cycle corrector 203 corrects the duty ratio of the clock signal, the duty cycle distortion (DCD) sometimes occurs in the serial data TXOUT due to a mismatch of a threshold value of a transistor configuring the buffer 206, or insufficient band, and the like. Hereinafter, a transmission circuit capable of reducing the duty cycle distortion of the serial data TXOUT will be explained while referring to FIG. 3.

FIG. 3 is a diagram illustrating a configuration example of a transmission circuit 300 according to the first embodiment. The transmission circuit 300 corresponds to the transmission circuit 101 in FIG. 1, and uses single-ended clock signal and data. The transmission circuit 300 has a clock generating circuit 301, a DCD adjusting circuit 302, a DCD detecting circuit 303, a DCD controlling circuit 304, buffers 305, 307, 308, and a multiplexer 306.

The clock generating circuit 301 has a phase frequency comparator (PFC) 311, a charge pump (CP) 312, a low pass filter (LPF) 313, a voltage controlled oscillator (VCO) 314, and a frequency divider 315, and supplies a clock signal. The voltage controlled oscillator 314 generates a clock signal with a frequency according to an output voltage of the low pass filter 313. The frequency divider 315 divides the frequency of the clock signal generated by the voltage controlled oscillator 314, and outputs the frequency-divided clock signal to the phase frequency comparator 311. The phase frequency comparator 311 compares a phase frequency of the clock signal output by the frequency divider 315 and a phase frequency of a reference clock signal RCLK, and outputs an up signal or a down signal to the charge pump 312 according to a result of the comparison. The charge pump 312 increases the output voltage when the up signal is input thereto, and it lowers the output voltage when the down signal is input thereto. The low pass filter 313 performs low pass filtering on the output voltage of the charge pump 312, and outputs the low pass filtered voltage to the voltage controlled oscillator 314. Consequently, the voltage controlled oscillator 314 can generate a single-ended clock signal which is synchronized with the reference clock signal RCLK.

The DCD adjusting circuit 302 has resistors 321 to 328, selectors 329, 330, capacitors 331, 332, a p-channel field effect transistor 333, and an n-channel field effect transistor 334. A node N1 is connected to an output node of the voltage controlled oscillator 314. The capacitor 331 is connected between a gate of the p-channel field effect transistor 333 and the node N1. The capacitor 332 is connected between a gate of the n-channel field effect transistor 334 and the node N1. The p-channel field effect transistor 333 has a source connected to a power supply potential node, and a drain connected to a node N2. The n-channel field effect transistor 334 has a drain connected to the node N2, and a source connected to a reference potential node (ground potential node).

The plurality of resistors 321 to 324 are connected in series between the power supply potential node and the reference potential node, and output a plurality of voltages from interconnection points. The selector 329 applies, under the control of the DCD controlling circuit 304, one voltage among the plurality of voltages output by the resistors 321 to 324, to the gate of the p-channel field effect transistor 333.

The plurality of resistors 325 to 328 are connected in series between the power supply potential node and the reference potential node, and output a plurality of voltages from interconnection points. The selector 330 applies, under the control of the DCD controlling circuit 304, one voltage among the plurality of voltages output by the resistors 325 to 328, to the gate of the n-channel field effect transistor 334.

The p-channel field effect transistor 333 and the n-channel field effect transistor 334 configure an inverter, and output a clock signal as a result of inverting the clock signal at the node N1, from the node N2. The selectors 329 and 330 control an input common voltage of the inverter, to thereby control a duty ratio of the clock signal at the node N2 to adjust the DCD of the data TXOUT. The DCD adjusting circuit 302 can control the duty ratio of the clock signal at the node N2.

The buffer 305 amplifies the clock signal at the node N2, and outputs the amplified clock signal to the multiplexer 306. The multiplexer 306 converts parallel data D1 and D2 to serial data in synchronization with the clock signal output by the buffer 305, and outputs the serial data. The multiplexer 306 converts the single-ended parallel data D1 and D2 to the single-ended serial data in synchronization with the single-ended clock signal. For example, the multiplexer 306 outputs the data D1 in a period in which the clock signal is at a high level, and it outputs the data D2 in a period in which the clock signal is at a low level. Specifically, the multiplexer 306 alternately outputs the data D1 and the data D2. The multiplexer 306 is a data generating circuit, and generates the serial data based on the clock signal.

The buffer 307 amplifies the data output by the multiplexer 306, and outputs the amplified data. The buffer 308 is a buffer at a final stage of the transmission circuit 300, and it amplifies the data output by the buffer 307 and outputs the amplified data TXOUT.

The transmission circuit 300 has a test mode and a normal mode. The test mode is a mode for adjusting the DCD of the data TXOUT. The normal mode is a mode for transmitting desired data TXOUT. The transmission circuit 300 adjusts the DCD of the data TXOUT in the test mode, and after that, it transmits the desired data TXOUT in the normal mode.

First, the transmission circuit 300 is made to operate in the test mode when a power is supplied, for example, and inputs the data D1 fixed to "0" and the data D2 fixed to "1" thereto from the processing circuit 103. For example, the data of "0" indicates a low level, and the data of "1" indicates a high level. The multiplexer 306 alternately outputs the data of "0" and the data of "1" in a manner such as "010101011 . . . ".

The DCD detecting circuit 303 inputs output data of the buffer 307 and an intermediate potential vdd/2 thereto, and detects a duty cycle distortion (DCD) of the output data of the buffer 307. The output data of the buffer 307 at a high level is a potential vdd, and the output data of the buffer 307 at a low level is 0 V. The intermediate potential vdd/2 is a potential in the middle of the high-level potential vdd of the output data and the low-level potential 0 V of the output data. Here, vdd is an operating power supply voltage of the integrated circuit 100, for example.

The DCD is a distortion caused when a pulse width of data of "1" and a pulse width of data of "0" are different. For example, FIG. 6A illustrates a waveform of data in which the DCD exists, in which a pulse width of data of "1" and a pulse width of data of "0" are different. FIG. 6B illustrates a waveform of data in which no DCD exists, in which a pulse width of data of "1" and a pulse width of data of "0" are the same.

FIG. 4 is a circuit diagram illustrating a configuration example of the DCD detecting circuit 303. The DCD detecting circuit 303 has resistors 401, 402, capacitors 403, 404, and a comparison circuit 405. The resistor 401 is connected between an output node of the buffer 307 in FIG. 3 and a node of an input potential V1 of the comparison circuit 405. The capacitor 403 is connected between the node of the input potential V1 of the comparison circuit 405 and a reference potential node. The resistor 401 and the capacitor 403 configure a low pass filter, and perform low pass filtering on an output potential (output signal) of the buffer 307 to output a time average value of the output potential of the buffer 307 as the input potential V1. In the test mode, the buffer 307 alternately outputs data at a low level and data at a high level. Therefore, when no DCD exists in the output potential of the buffer 307, the input potential V1 becomes the same potential as the intermediate potential vdd/2. Further, when the DCD exists in the output potential of the buffer 307, the input potential V1 becomes a potential different from the intermediate potential vdd/2.

The resistor 402 is connected between a node of the intermediate potential vdd/2 in FIG. 3 and a node of an input potential V2 of the comparison circuit 405. The capacitor 404 is connected between the node of the input potential V2 of the comparison circuit 405 and a reference potential node. The resistor 402 and the capacitor 404 configure a low pass filter, and perform low pass filtering on the intermediate potential vdd/2 to output a time average value of the intermediate potential vdd/2 as the input potential V2. The input potential V2 becomes the same potential as the intermediate potential vdd/2. The comparison circuit 405 compares the input potential V1 and the input potential (threshold value) V2, and outputs a result of the comparison.

In FIG. 3, the DCD controlling circuit 304 can determine that no DCD exists in the output data of the buffer 307 when the input potential V1 and the input potential V2 are the same, and determine that the DCD exists in the output data of the buffer 307 when the input potential V1 and the input potential V2 are different. The DCD controlling circuit 304 controls the selectors 329 and 330 so that the input potential V1 and the input potential V2 become the same. Consequently, it is possible to reduce the DCD that exists in the output data of the buffer 307 and the data TXOUT.

As described above, the DCD adjusting circuit 302, the DCD detecting circuit 303, and the DCD controlling circuit 304 function as a duty ratio controlling circuit which detects the DCD of the data and controls the duty ratio of the clock signal based on the detection result.

Note that it is possible that the DCD detecting circuit 303 inputs output data of the buffer 308 at the final stage (output data of an output terminal of the transmission circuit 300) TXOUT and an intermediate potential thereto, and detects the DCD of the output data TXOUT of the output terminal of the transmission circuit 300. The intermediate potential is a potential in the middle of the output data at a high level of the buffer 308 and the output data at a low level of the buffer 308. Consequently, it is possible to reduce the DCD of the output data TXOUT of the output terminal of the transmission circuit 300. However, there is a case where an amplitude of the output data of the buffer 308 at the final stage is smaller than an amplitude of the output data of the buffer 307 which is previous to the buffer 308 by one stage, depending on an operating power supply voltage of a circuit (external system) to be a transmission destination of the output data of the transmission circuit 300. In this case, since the amplitude of the output data of the buffer 308 is smaller than the amplitude of the output data of the buffer 307, there is a demerit that a detection accuracy of the DCD is lowered. Further, since the DCD detecting circuit 303 is connected to the output terminal of the transmission circuit 300, there is a demerit that the DCD detecting circuit 303 exerts an adverse effect on the external system such that impedance match is impaired.

In order to eliminate the above-described demerits, it is preferable that the DCD detecting circuit 303 inputs the input data of the buffer 308 at the final stage of the transmission circuit 300 (the output data of the buffer 307 which is previous to the buffer 308 by one stage) and the intermediate potential vdd/2 thereto, and detects the DCD of the input data of the buffer 308 at the final stage of the transmission circuit 300, as illustrated in FIG. 3. In this case, since the amplitude of the output data of the buffer 307 is larger than the amplitude of the output data of the buffer 308, it is possible to improve the detection accuracy of the DCD. Further, since the DCD detecting circuit 303 is not connected to the output terminal of the transmission circuit 300, it is possible to prevent the adverse effect exerted on the external system by the DCD detecting circuit 303.

FIG. 5A is a diagram illustrating an example of waveform of a clock signal at the node N2 before performing the DCD adjustment. The selector 329 applies a potential in the middle of the power supply potential and the reference potential to the gate of the p-channel field effect transistor 333. The selector 330 applies a potential in the middle of the power supply potential and the reference potential to the gate of the n-channel field effect transistor 334. In this case, the node N2 outputs a clock signal illustrated in FIG. 5A. A duty ratio of the clock signal in FIG. 5A is about 50%.

FIG. 6A is a diagram illustrating an example of waveform of output data of the buffer 307 before performing the DCD adjustment. When the node N2 outputs the clock signal illustrated in FIG. 5A, the buffer 307 outputs data illustrated in FIG. 6A. This data is data in which data of "0" and data of "1" are alternately repeated. For example, this data at a high level is +1 V, and this data at a low level is −1 V. In this case, the DCD detecting circuit 303 inputs the output potential of the buffer 307 and the intermediate potential 0 V thereto. In the data in FIG. 6A, a high-level period indicating the data of "1" is shorter than a low-level period indicating the data of "0", and thus there exists the DCD. Therefore, the input potential V1 in FIG. 4 becomes a negative potential. The input potential V2 becomes 0 V. The comparison circuit 405 outputs a signal indicating that the input potential V1 is lower than the input potential V2. The DCD controlling circuit 304 controls the selectors 329 and 330 based on the output signal of the comparison circuit 405, thereby performing the DCD adjustment.

FIG. 5B is a diagram illustrating an example of waveform of a clock signal at the node N2 after performing the DCD adjustment. The selector 329 applies a potential lower than the potential in the middle of the power supply potential and the reference potential to the gate of the p-channel field effect transistor 333. The output potential of the selector 329 in FIG. 5B is lower than the output potential of the selector 329 in FIG. 5A. Further, the selector 330 applies a potential higher than the potential in the middle of the power supply potential and the reference potential to the gate of the n-channel field effect transistor 334. The output potential of the selector 330 in FIG. 5B is higher than the output potential of the selector 330 in FIG. 5A. In this case, the node N2 outputs a clock signal illustrated in FIG. 5B. A duty ratio of the clock signal in FIG. 5B is about 54%.

FIG. 6B is a diagram illustrating an example of waveform of output data of the buffer 307 after performing the DCD adjustment. When the node N2 outputs the clock signal illustrated in FIG. 5B, the buffer 307 outputs data illustrated in FIG. 6B. Regarding the data in FIG. 6B, a high-level period indicating the data of "1" is substantially the same as a low-level period indicating the data of "0", and thus there exists no DCD. The input potential V1 in FIG. 4 becomes substantially 0 V. The input potential V2 becomes 0 V. The input potential V1 is substantially the same as the input potential V2. The DCD controlling circuit 304 maintains the output potentials of the selectors 329 and 330 based on the output signal of the comparison circuit 405. Consequently, it is possible to reduce the DCD of the output data of the buffer 307 and the data TXOUT.

Figure 7:
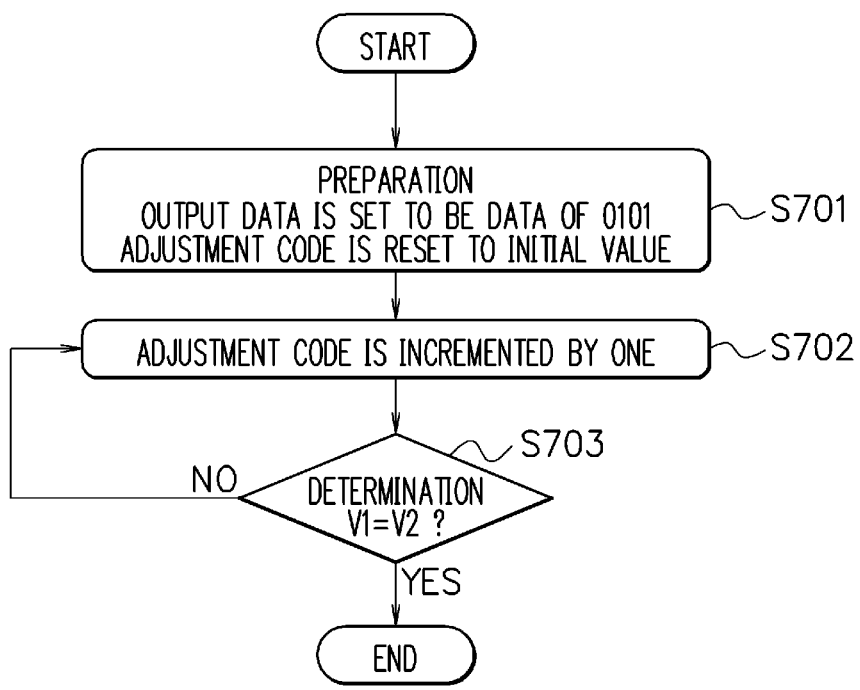
FIG. 7 is a flow chart illustrating a control method of a test mode of the integrated circuit.

FIG. 7 is a flow chart illustrating a control method of the test mode of the integrated circuit 100. In step S701, the integrated circuit 100 performs preparation processing of the test mode. The processing circuit 103 fixes the data D1 to "0", and fixes the data D2 to "1". The multiplexer 306 outputs "010101 . . . ". The DCD controlling circuit 304 resets an adjustment code to an initial value, and outputs the adjustment code of the initial value to the selectors 329 and 330. For example, the initial value of the adjustment code is a minimum value.

Next, in step S702, the DCD controlling circuit 304 adds 1 to the adjustment code, and outputs the adjustment code after performing the addition to the selectors 329 and 330. The selector 329 applies a voltage according to the adjustment code to the gate of the p-channel field effect transistor 333. The selector 330 applies a voltage according to the adjustment code to the gate of the n-channel field effect transistor 334.

Next, in step S703, the DCD controlling circuit 304 determines whether or not the input potential V1 is the same as the input potential V2 in FIG. 4, based on an output signal of the DCD detecting circuit 303. When the input potential V1 is not the same as the input potential V2, the DCD controlling circuit 304 returns to step S702 to repeat the above-described processing. In accordance with the increment of the adjustment code, the input potential V1 becomes close to the input potential V2. When the DCD controlling circuit 304 determines that the input potential V1 is the same as the input potential V2, it maintains the adjustment code, and terminates the processing of the test mode. Consequently, it is possible to reduce the DCD of the data TXOUT. After that, the integrated circuit 100 performs processing of the normal mode.

As described above, even when the duty ratio of the clock signal at the node N2 is 50%, the DCD sometimes exists in the data TXOUT due to a mismatch of a threshold value of a transistor configuring the buffer 307, and the like. According to the present embodiment, the DCD detecting circuit 303 detects the DCD of the output data of the buffer 307 or 308. The DCD adjusting circuit 302 controls, under the control of the DCD controlling circuit 304, the duty ratio of the clock signal at the node N2 based on the detection result. This makes it possible to reduce the DCD of the data TXOUT. By reducing the DCD of the data TXOUT, the quality of the data TXOUT is improved, and the reception circuit can reduce a reproduction error of the received data TXOUT.

(Second Embodiment)

Figure 8:
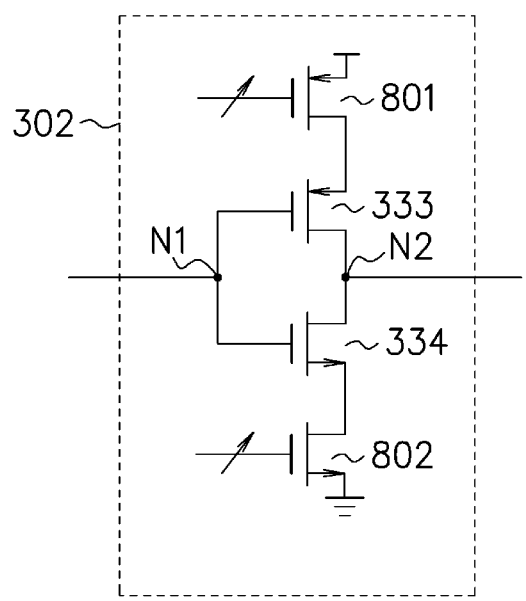
FIG. 8 is a circuit diagram illustrating a configuration example of a DCD adjusting circuit according to a second embodiment.

FIG. 8 is a circuit diagram illustrating a configuration example of a DCD adjusting circuit 302 according to a second embodiment. An integrated circuit 100 according to the second embodiment is different from the integrated circuit 100 according to the first embodiment regarding the DCD adjusting circuit 302. Hereinafter, a point at which the second embodiment is different from the first embodiment will be described.

The DCD controlling circuit 302 has p-channel field effect transistors 333, 801, and n-channel field effect transistors 334, 802. The node N1 is connected to the voltage controlled oscillator 314 in FIG. 3. The node N2 is connected to an input node of the buffer 305 in FIG. 3.

The p-channel field effect transistor 801 has a source connected to a power supply potential node, a gate connected to the DCD controlling circuit 304 in FIG. 3, and a drain connected to a source of the p-channel field effect transistor 333. The p-channel field effect transistor 333 has a gate connected to the node N1, and a drain connected to the node N2. The n-channel field effect transistor 334 has a drain connected to the node N2, a gate connected to the node N1, and a source connected to a drain of the n-channel field effect transistor 802. The n-channel field effect transistor 802 has a gate connected to the DCD controlling circuit 304 in FIG. 3, and a source connected to a reference potential node.

The p-channel field effect transistor 801 functions as a resistor. The DCD controlling circuit 304 can change a resistance value of the p-channel field effect transistor 801 by controlling a gate voltage of the p-channel field effect transistor 801. The resistance value of the p-channel field effect transistor 801 and a parasitic capacitance connected to the node N2 configure a CR circuit, and can decide a rising speed (CR time constant) of a clock signal at the node N2. The DCD controlling circuit 304 can change the rising speed of the clock signal at the node N2 by controlling the resistance value of the p-channel field effect transistor 801.

In a similar manner, the n-channel field effect transistor 802 functions as a resistor. The DCD controlling circuit 304 can change a resistance value of the n-channel field effect transistor 802 by controlling a gate voltage of the n-channel field effect transistor 802. The resistance value of the n-channel field effect transistor 802 and a parasitic capacitance connected to the node N2 configure a CR circuit, and can decide a falling speed (CR time constant) of the clock signal at the node N2. The DCD controlling circuit 304 can change the falling speed of the clock signal at the node N2 by controlling the resistance value of the n-channel field effect transistor 802.

The DCD controlling circuit 304 can change a duty ratio of the clock signal at the node N2 by controlling the rising speed and the falling speed of the clock signal at the node N2.

For example, the DCD controlling circuit 304 controls each of the resistance value of the p-channel field effect transistor 801 and the resistance value of the n-channel field effect transistor 802 to a standard value. Consequently, the duty ratio of the clock signal at the node N2 becomes about 50%, as illustrated in FIG. 5A. In that case, the buffer 307 outputs data in which the DCD exists, as illustrated in FIG. 6A.

After that, the DCD controlling circuit 304 makes the resistance value of the p-channel field effect transistor 801 to be smaller than the standard value, and makes the resistance value of the n-channel field effect transistor 802 to be larger than the standard value. Consequently, the rising speed of the clock signal at the node N2 becomes fast, and the falling speed of the clock signal at the node N2 becomes slow, resulting in that the duty ratio becomes larger than 50%, as illustrated in FIG. 5B. In that case, the buffer 307 can output data in which no DCD exists, as illustrated in FIG. 6B.

As described above, the DCD controlling circuit 304 controls the rising speed and the falling speed of the clock signal at the node N2, based on the detection result obtained by the DCD detecting circuit 303. This makes it possible to reduce the DCD of the data TXOUT.

(Third Embodiment)

Figure 9:
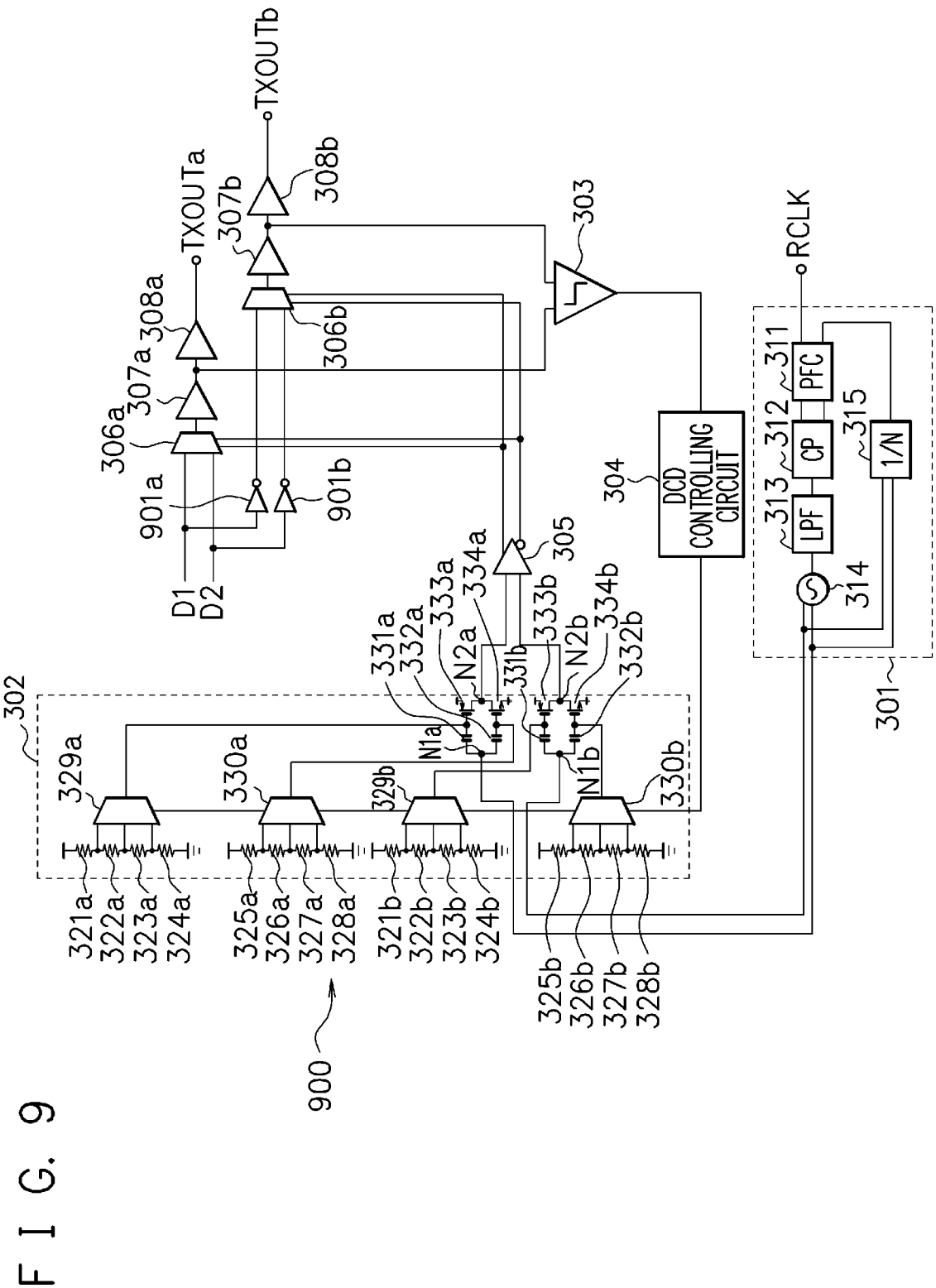
FIG. 9 is a diagram illustrating a configuration example of a transmission circuit according to a third embodiment.

FIG. 9 is a diagram illustrating a configuration example of a transmission circuit 900 according to a third embodiment. The transmission circuit 900 corresponds to the transmission circuit 101 in FIG. 1, and uses differential clock signals and data. An integrated circuit 100 according to the third embodiment is different from the integrated circuit 100 according to the first embodiment regarding the transmission circuit 900. Hereinafter, a point at which the third embodiment is different from the first embodiment will be described.

In the clock generating circuit 301, the voltage controlled oscillator 314 outputs a first clock signal and a second clock signal which are mutually inverted. The first clock signal and the second clock signal are differential signals. A node N1*a* is a node of the first clock signal. A node N1*b* is a node of the second clock signal.

A DCD adjusting circuit 302 has resistors 321*a* to 328*a*, 321*b* to 328*b*, selectors 329*a*, 330*a*, 329*b*, 330*b*, capacitors 331*a*, 332*a*, 331*b*, 332*b*, p-channel field effect transistors 333*a*, 333*b*, and n-channel field effect transistors 334*a*, 334*b*.

The capacitor 331*a* is connected between a gate of the p-channel field effect transistor 333*a* and the node N1*a*. The capacitor 332*a* is connected between a gate of the n-channel field effect transistor 334*a* and the node N1*a*. The p-channel field effect transistor 333*a* has a source connected to a power supply potential node, and a drain connected to a node N2*a*. The n-channel field effect transistor 334*a* has a drain connected to the node N2*a*, and a source connected to a reference potential node.

The capacitor 331*b* is connected between a gate of the p-channel field effect transistor 333*b* and the node N1*b*. The capacitor 332*b* is connected between a gate of the n-channel field effect transistor 334*b* and the node N1*b*. The p-channel field effect transistor 333*b* has a source connected to a power supply potential node, and a drain connected to a node N2*b*. The n-channel field effect transistor 334*b* has a drain connected to the node N2*b*, and a source connected to a reference potential node.

The plurality of resistors 321*a* to 324*a* are connected in series between the power supply potential node and the reference potential node, and output a plurality of voltages from interconnection points. The selector 329*a* applies, under the control of the DCD controlling circuit 304, one voltage among the plurality of voltages output by the resistors 321*a* to 324*a*, to the gate of the p-channel field effect transistor 333*a*.

The plurality of resistors 325*a* to 328*a* are connected in series between the power supply potential node and the reference potential node, and output a plurality of voltages from interconnection points. The selector 330*a* applies, under the control of the DCD controlling circuit 304, one voltage among the plurality of voltages output by the resistors 325*a* to 328*a*, to the gate of the n-channel field effect transistor 334*a*.

The plurality of resistors 321*b* to 324*b* are connected in series between the power supply potential node and the reference potential node, and output a plurality of voltages from interconnection points. The selector 329*b* applies, under the control of the DCD controlling circuit 304, one voltage among the plurality of voltages output by the resistors 321*b* to 324*b*, to the gate of the p-channel field effect transistor 333*b*.

The plurality of resistors 325*b* to 328*b* are connected in series between the power supply potential node and the reference potential node, and output a plurality of voltages from interconnection points. The selector 330*b* applies, under the control of the DCD controlling circuit 304, one voltage among the plurality of voltages output by the resistors 325*b* to 328*b*, to the gate of the n-channel field effect transistor 334*b*.

The p-channel field effect transistor 333*a* and the n-channel field effect transistor 334*a* configure an inverter, invert the first clock signal at the node N1*a* and output the inverted clock signal to the node N2*a*. The p-channel field effect transistor 333*b* and the n-channel field effect transistor 334*b* configure an inverter, invert the second clock signal at the node N1*b* and output the inverted clock signal to the node N2*b*. The clock signal at the node N2*a* and the clock signal at the node N2*b* are mutually-inverted differential signals. The selectors 329*a*, 330*a*, 329*b*, and 330*b* control input common voltages of those inverters to adjust duty ratios of the clock signals at the nodes N2*a* and N2*b*, thereby adjusting the DCD of the data TXOUT.

The buffer 305 is a differential buffer, amplifies the differential clock signals at the nodes N2*a* and N2*b*, and output the amplified differential clock signals to multiplexers 306*a* and 306*b*. The multiplexer 306*a* converts, in synchronization with the differential clock signals output by the buffer 305, parallel data D1 and D2 to serial data, and outputs the serial data. An inverter 901*a* outputs data as a result of inverting the data D1. An inverter 901*b* outputs data as a result of inverting the data D2. The multiplexer 306*b* converts, in synchronization with the differential clock signals output by the buffer 305, the parallel data output by the inverters 901*a* and 901*b* to serial data, and outputs the serial data. The serial data output by the multiplexer 306*a* and the serial data output by the multiplexer 306*b* are mutually-inverted differential data. The multiplexers 306*a* and 306*b* convert, in synchronization with the differential clock signals, the differential parallel data D1 and D2 to the differential serial data.

For example, the buffer 305 outputs differential clock signals formed of a third clock signal and a fourth clock signal. The multiplexer 306*a* outputs the data D1 in a period in which the third clock signal is at a high level, and outputs the data D2 in a period in which the fourth clock signal is at a high level. Specifically, the multiplexer 306*a* alternately outputs the data D1 and the data D2.

The multiplexer 306*b* outputs the output data of the inverter 901*a* in a period in which the fourth clock signal is at a high level, and outputs the output data of the inverter 901*b* in a period in which the third clock signal is at a high level. Specifically, the multiplexer 306*b* alternately outputs the output data of the inverter 901*a* and the output data of the inverter 901*b*.

A buffer 307*a* amplifies the data output by the multiplexer 306*a*, and outputs the amplified data. A buffer 308*a* is a buffer at a final stage of the transmission circuit 900, amplifies the data output by the buffer 307*a*, and outputs the amplified data TXOUTa.

A buffer 307*b* amplifies the data output by the multiplexer 306*b*, and outputs the amplified data. A buffer 308*b* is a buffer at a final stage of the transmission circuit 900, amplifies the data output by the buffer 307*b*, and outputs the amplified data TXOUTb. The data TXOUTa and the data TXOUTb are mutually-inverted differential data. The transmission circuit 900 transmits the data TXOUTa and TXOUTb.

First, in the test mode, the transmission circuit 900 inputs the data D1 fixed to "0" and the data D2 fixed to "1" thereto from the processing circuit 103. The multiplexer 306*a* outputs data in which the data of "0" and the data of "1" are alternately repeated in a manner such as "01010101 . . . ". The multiplexer 306*b* outputs data in which the data of "1" and the data of "0" are alternately repeated in a manner such as "10101010 . . . ".

The DCD detecting circuit 303 inputs the output data of the buffer 307*a* and the output data of the buffer 307*b* thereto, and detects a duty cycle distortion (DCD) of the output data of the buffers 307*a* and 307*b*. The DCD detecting circuit 303 has a configuration illustrated in FIG. 4.

The resistor 401 is connected to an output node of the buffer 307*a*. The resistor 401 and the capacitor 403 generate an input potential V1 obtained by performing low pass filtering on an output potential (output signal) of the buffer 307*a*. The resistor 402 is connected to an output node of the buffer 307*b*. The resistor 402 and the capacitor 404 generate an input potential V2 obtained by performing low pass filtering on an output potential (output signal) of the buffer 307*b*.

In the test mode, the buffer 307*a* alternately outputs data at a low level and data at a high level. Therefore, when no DCD exists in the output potential of the buffer 307*a*, the input potential V1 becomes the same potential as the intermediate potential vdd/2. Further, when the DCD exists in the output potential of the buffer 307*a*, the input potential V1 becomes a potential different from the intermediate potential vdd/2.

Further, in the test mode, the buffer 307*b* alternately outputs data at a high level and data at a low level. Therefore, when no DCD exists in the output potential of the buffer 307*b*, the input potential V2 becomes the same potential as the intermediate potential vdd/2. Further, when the DCD exists in the output potential of the buffer 307*b*, the input potential V2 becomes a potential different from the intermediate potential vdd/2. The comparison circuit 405 compares the input potential V1 and the input potential V2, and outputs a result of the comparison.

In FIG. 9, the DCD controlling circuit 304 determines that no DCD exists in the output data of the buffers 307*a* and 307*b* when the input potential V1 and the input potential V2 are the same. Further, the DCD controlling circuit 304 determines that the DCD exists in the output data of the buffers 307*a* and 307*b* when the input potential V1 and the input potential V2 are different. The DCD controlling circuit 304 controls the selectors 329*a*, 330*a*, 329*b*, and 330*b* so that the input potential V1 and the input potential V2 become the same. Consequently, it is possible to reduce the DCD that exists in the data TXOUTa and TXOUTb.

Note that it is possible that the DCD detecting circuit 303 inputs the output data of the buffers 308*a* and 308*b* at the final stage (output data of output terminals of the transmission circuit 900) TXOUTa and TXOUTb thereto, and detects the DCD of the output data TXOUTa and TXOUTb of the output terminals of the transmission circuit 900, similarly to the first embodiment.

Further, it is also possible that the DCD controlling circuit 302 has a configuration similar to the configuration in FIG. 8, and controls a rising speed and a falling speed of the clock signals at the nodes N2*a* and N2*b*, similarly to the second embodiment.

According to the present embodiment, the DCD detecting circuit 303 detects the DCD of the differential data. The DCD adjusting circuit 302 controls, under the control of the DCD controlling circuit 304, the duty ratio of the differential clock signals at the nodes N2*a* and N2*b* based on the detection result. This makes it possible to reduce the DCD of the differential data TXOUTa and TXOUTb. By reducing the DCD of the data TXOUTa and TXOUTb, the quality of the data TXOUTa and TXOUTb is improved, and the reception circuit can reduce a reproduction error of the received data TXOUTa and TXOUTb.

In one aspect, it is possible to reduce a duty cycle distortion.

Note that the above-described embodiments merely illustrate concrete examples of implementing the present embodiments, and the technical scope of the present embodiments is not to be construed in a restrictive manner by these embodiments. That is, the present embodiments may be implemented in various forms without departing from the technical spirit or main features thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A transmission circuit, comprising:
a data generating circuit configured to generate data based on a clock signal;
a clock generating circuit configured to supply the clock signal to the data generating circuit; and
a duty ratio controlling circuit configured to detect a duty cycle distortion of the data output from the data generating circuit, and control a duty ratio of the clock signal based on a result of the detection,
wherein the duty ratio controlling circuit is configured to detect a duty cycle distortion of input data of a buffer which is provided at a final stage of the transmission circuit.
2. The transmission circuit according to claim 1, wherein the duty ratio controlling circuit comprises an inverter configured to output the clock signal, and is configured to control an input common voltage of the inverter based on the result of the detection.
3. The transmission circuit according to claim 1, wherein the duty ratio controlling circuit is configured to control a rising speed and a falling speed of the clock signal based on the result of the detection.
4. The transmission circuit according to claim 1, wherein the duty ratio controlling circuit comprises:
a p-channel field effect transistor;

an n-channel field effect transistor a drain of which is connected to a drain of the p-channel field effect transistor;
a first capacitor connected between a gate of the p-channel field effect transistor and the clock generating circuit;
a second capacitor connected between a gate of the n-channel field effect transistor and the clock generating circuit; and
a control circuit configured to control voltages applied to the gate of the p-channel field effect transistor and the gate of the n-channel field effect transistor based on the result of the detection.

5. The transmission circuit according to claim 1, wherein: the duty ratio controlling circuit comprises:
a p-channel field effect transistor a gate of which is connected to the clock generating circuit;
an n-channel field effect transistor a gate of which is connected to the clock generating circuit, and a drain of which is connected to a drain of the p-channel field effect transistor;
a first resistor connected to a source of the p-channel field effect transistor; and
a second resistor connected to a source of the n-channel field effect transistor, and
wherein a value of the first resistor and a value of the second resistor are controlled based on the result of the detection.

6. The transmission circuit according to claim 1, wherein: the clock generating circuit is configured to output a first clock signal and a second clock signal which are complementary to each other; and
the duty ratio controlling circuit comprises:
a first p-channel field effect transistor;
a first n-channel field effect transistor a drain of which is connected to a drain of the first p-channel field effect transistor;
a first capacitor connected between a gate of the first p-channel field effect transistor and a node of the first clock signal;
a second capacitor connected between a gate of the first n-channel field effect transistor and the node of the first clock signal;
a second p-channel field effect transistor;
a second n-channel field effect transistor a drain of which is connected to a drain of the second p-channel field effect transistor;
a third capacitor connected between a gate of the second p-channel field effect transistor and a node of the second clock signal;
a fourth capacitor connected between a gate of the second n-channel field effect transistor and the node of the second clock signal; and
a control circuit configured to control voltages applied to the gate of the first p-channel field effect transistor, the gate of the first n-channel field effect transistor, the gate of the second p-channel field effect transistor, and the gate of the second n-channel field effect transistor.

7. The transmission circuit according to claim 1, wherein the duty ratio controlling circuit comprises a comparison circuit configured to compare, when the data generating circuit alternately outputs high-level data and low-level data, a signal obtained by performing low pass filtering on an output signal of the data generating circuit and a threshold value.

8. The transmission circuit according to claim 1, wherein the duty ratio controlling circuit comprises a comparison circuit configured to compare, when the data generating circuit outputs first data in which a high level and a low level are alternately repeated and second data obtained by inverting the first data, a signal obtained by performing low pass filtering on the first data and a signal obtained by performing low pass filtering on the second data.

9. An integrated circuit, comprising:
a processing circuit configured to generate internal data; and
a transmission circuit configured to input the internal data thereto, wherein
the transmission circuit comprises:
a data generating circuit configured to generate data based on a clock signal;
a clock generating circuit configured to supply the clock signal to the data generating circuit; and
a duty ratio controlling circuit configured to detect a duty cycle distortion of the data output from the data generating circuit, and control a duty ratio of the clock signal based on a result of the detection,
wherein the duty ratio controlling circuit is configured to detect a duty cycle distortion of input data of a buffer which is provided at a final stage of the transmission circuit.

10. The integrated circuit according to claim 9, wherein the duty ratio controlling circuit comprises an inverter configured to output the clock signal, and is configured to control an input common voltage of the inverter based on the result of the detection.

11. The integrated circuit according to claim 9, wherein the duty ratio controlling circuit is configured to control a rising speed and a falling speed of the clock signal based on the result of the detection.

12. The integrated circuit according to claim 9, wherein the duty ratio controlling circuit comprises:
a p-channel field effect transistor;
an n-channel field effect transistor a drain of which is connected to a drain of the p-channel field effect transistor;
a first capacitor connected between a gate of the p-channel field effect transistor and the clock generating circuit;
a second capacitor connected between a gate of the n-channel field effect transistor and the clock generating circuit; and
a control circuit configured to control voltages applied to the gate of the p-channel field effect transistor and the gate of the n-channel field effect transistor based on the result of the detection.

13. The integrated circuit according to claim 9, wherein: the duty ratio controlling circuit comprises:
a p-channel field effect transistor a gate of which is connected to the clock generating circuit;
an n-channel field effect transistor a gate of which is connected to the clock generating circuit, and a drain connected to a drain of the p-channel field effect transistor;
a first resistor connected to a source of the p-channel field effect transistor; and
a second resistor connected to a source of the n-channel field effect transistor, and
wherein a value of the first resistor and a value of the second resistor are controlled based on the result of the detection.

14. The integrated circuit according to claim 9, wherein: the clock generating circuit is configured to output a first clock signal and a second clock signal which are complementary to each other; and the duty ratio controlling circuit comprises:

a first p-channel field effect transistor;

a first n-channel field effect transistor a drain of which is connected to a drain of the first p-channel field effect transistor;

a first capacitor connected between a gate of the first p-channel field effect transistor and a node of the first clock signal;

a second capacitor connected between a gate of the first n-channel field effect transistor and the node of the first clock signal;

a second p-channel field effect transistor;

a second n-channel field effect transistor a drain of which is connected to a drain of the second p-channel field effect transistor;

a third capacitor connected between a gate of the second p-channel field effect transistor and a node of the second clock signal;

a fourth capacitor connected between a gate of the second n-channel field effect transistor and the node of the second clock signal; and a control circuit configured to control voltages applied to the gate of the first p-channel field effect transistor, the gate of the first n-channel field effect transistor, the gate of the second p-channel field effect transistor, and the gate of the second n-channel field effect transistor.

15. The integrated circuit according to claim 9, wherein the duty ratio controlling circuit comprises a comparison circuit configured to compare, when the data generating circuit alternately outputs high-level data and low-level data, a signal obtained by performing low pass filtering on an output signal of the data generating circuit and a threshold value.

16. The integrated circuit according to claim 9, wherein the duty ratio controlling circuit comprises a comparison circuit configured to compare, when the data generating circuit outputs first data in which a high level and a low level are alternately repeated and second data obtained by inverting the first data, a signal obtained by performing low pass filtering on the first data and a signal obtained by performing low pass filtering on the second data.

* * * * *